United States Patent
Aizawa

(10) Patent No.: US 7,167,374 B2
(45) Date of Patent: Jan. 23, 2007

(54) CIRCUIT SUBSTRATE AND ELECTRONIC EQUIPMENT

(75) Inventor: Osamu Aizawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 223 days.

(21) Appl. No.: 10/668,372

(22) Filed: Sep. 24, 2003

(65) Prior Publication Data

US 2004/0188815 A1 Sep. 30, 2004

(30) Foreign Application Priority Data

Sep. 25, 2002 (JP) .............................. 2002-279304

(51) Int. Cl.
 *H05K 1/18* (2006.01)

(52) U.S. Cl. ...................... 361/760; 361/760; 361/766; 361/306.2

(58) Field of Classification Search ............. 361/306.2, 361/760–766, 782–784; 257/685–691
 See application file for complete search history.

(56) References Cited

U.S. PATENT DOCUMENTS 5,694,296 A * 12/1997 Urbish et al. ............... 361/774
5,929,646 A * 7/1999 Patel et al. .................. 324/754
6,320,249 B1 * 11/2001 Yoon .......................... 257/678
6,373,714 B1 * 4/2002 Kudoh et al. ................ 361/760
6,418,029 B1 * 7/2002 McKee et al. .............. 361/760
6,876,091 B1 * 4/2005 Takeuchi et al. ............. 257/793

FOREIGN PATENT DOCUMENTS

JP 2001-144246 5/2001

* cited by examiner

*Primary Examiner*—Tuan Dinh
(74) *Attorney, Agent, or Firm*—Westerman, Hattori, Daniels & Adrian, LLP.

(57) ABSTRACT

A circuit substrate comprises a first substrate on a first surface of which circuit elements are loaded, a second substrate on which the first substrate is loaded, and noise reduction elements. Each of the noise reduction elements is sandwiched between an area of a second surface of the first substrate over against the first surface of the first substrate and a surface of the second substrate facing the second surface of the first substrate. The noise reduction element is connected between a power source terminal of the second surface of the first substrate and a power source terminal of the surface of the second substrate, and/or between a ground terminal of the second surface of the first substrate and a ground terminal of the surface of the second substrate.

10 Claims, 5 Drawing Sheets

CIRCUIT SUBSTRATE AND ELECTRONIC EQUIPMENT

BACKGROUND OF THE INVENTION

1. Field of the Invention

The present invention relates to a circuit substrate having a first substrate that is loaded with circuit elements on a first surface thereof and a second substrate that is loaded with the first substrate, and electronic equipment that is loaded with the circuit substrate and is formed on the circuit substrate.

2. Description of the Related Art

Noise reduction elements for reducing noises between a power source and the ground are provided in the vicinity of a semiconductor chip that is loaded onto a board such as a mother board and a daughter board.

FIG. 1 is a view typically showing a conventional example in which a semiconductor chip is loaded onto a mother board.

According to the conventional example shown in FIG. 1, first, a substrate 80 is prepared in addition to a mother board 70, and a semiconductor chip 60 is mounted on a surface 80a of the additionally prepared substrate 80 and in addition noise reduction elements 90 are disposed around the mounted semiconductor chip 60, but the semiconductor chip 60 is not mounted directly on a surface 70a of the mother board 70. On a back surface 80b of the substrate 80, there is formed a large number of pads (not illustrated). And at the position of the back surface 80b, wherein the respective pad is formed, there is provided a soldering ball 81. On the other hand, also on the surface 70a of the mother board 70, as shown in FIG. 1 indicating part of the mother board 70, there is formed a large number of pads 71. Further, on the surface 70a of the mother board 70 there are provided soldering resists 72 each between the mutually adjacent pads 71.

In FIG. 1, as well as in FIG. 2 which will be later described, for the sake of the better understanding of the soldering balls 81 and the pads 71 on the surface 70a of the mother board 70, there are shown the soldering balls 81 and the pads 71 with enlargement and reducing the number of those elements. Further, while the semiconductor chip 60 mounted on the substrate 80 is packaged, FIG. 1 and FIG. 2 show the surface 80a of the substrate 80 removing a package member.

The substrate 80, on which the semiconductor chip 60 is mounted, is electronically connected with the mother board 70, when the soldering balls 81 are heated so that their pads are soldered. FIG. 1 shows a state before the soldering is carried out.

By the way, in order to enhance a noise reduction factor due to noise reduction elements, it is effective that the noise reduction elements are disposed in the vicinity of a semiconductor chip as closer as possible, or that the noise reduction elements are disposed as much as possible.

When the noise reduction elements are disposed on a board, if it is intended that a large number of noise reduction elements are disposed, it would undesirably involve a cost up and large-sizing of a board. Thus, it is tried that a noise reduction factor is enhanced with a small number of noise reduction elements. For example, as shown in FIG. 2, there is raised an example in which noise reduction elements are disposed in the vicinity of a semiconductor chip as closer as possible.

FIG. 2 is a view typically showing another conventional example in which a semiconductor chip is loaded onto a mother board.

A different point of the example shown in FIG. 2 from the example shown in FIG. 1 is that the noise reduction elements 90 are disposed on the back surface 80b of the substrate 80 on which the semiconductor chip 60 is mounted, but not on the surface 80a. Japanese Patent Publication TokuKai. 2001-144246 (pages 3–4, FIG. 1 and FIG. 2) discloses such a technology that the noise reduction elements 90 are disposed on the back surface 80b of the substrate 80.

The noise reduction elements 90 shown in FIG. 2 are disposed in an area S on the back surface 80b of the substrate 80, in which the semiconductor chip 60 is mounted on the surface 80a. On the back of the semiconductor chip 60, there are arranged several thousands of connection terminals at close intervals. When the semiconductor chip 60 is mounted on the substrate 80, the connection terminals of the back of the semiconductor chip 60 are electronically connected with the surface 80a of the substrate 80. According to the example shown in FIG. 2, the noise reduction elements 90 are located just below the connection terminals of the semiconductor chip 60, and thus are disposed nearer the semiconductor chip 60 as compare with the example shown in FIG. 1. Accordingly, the noise reduction factor by the noise reduction elements 90 shown in FIG. 2 will be enhanced.

However, an increment of the operating speed of the semiconductor chip needs further reduction of noises without an increment of the number of noise reduction elements.

By the way, an electric power is supplied via the mother board 70 to the semiconductor chip 60 which is mounted on the surface 80a of the substrate 80. That is, the electric power is supplied to the semiconductor chip 60 through the mother board 70, the soldering balls 81, and the substrate 80, in the named order. A large number of pads formed on the back surface 80b of the substrate 80 include a power pad connected to a power terminal, and a ground pad connected to a ground terminal, of the mounted semiconductor chip 60. In the event that the power pad is apart from the semiconductor chip 60, or the ground pad is apart from the semiconductor chip 60, it will cause large noises to be generated while the electric power is supplied to the semiconductor chip 60. In case of the example shown in FIG. 2, a power supply path to the semiconductor chip is elongated. Thus, this involves a possibility that it is difficult to reduce noises to a sufficient level, while a disposition of the noise reduction elements 90 nearer the semiconductor chip 60 as compared with the example shown in FIG. 1 makes it possible to enhance the noise reduction factor by the noise reduction elements 90.

SUMMARY OF THE INVENTION

In view of the foregoing, it is an object of the present invention to provide a circuit substrate and electronic equipment in which noises are reduced to a sufficient level.

To achieve the above-mentioned object, the present invention provides a circuit substrate comprising:

a first substrate on a first surface of which circuit elements are loaded;

a second substrate on which the first substrate is loaded; and noise reduction elements each sandwiched between an area of a second surface of the first substrate over against the first surface of the first substrate and a surface of the second substrate facing the second surface of the first substrate, the noise reduction elements each being connected between a power source terminal of the second surface of the first substrate and a power source terminal of the surface of the second substrate, and/or between a ground terminal of the second surface of the first substrate and a ground terminal of the surface of the second substrate.

According to the circuit substrate of the present invention as mentioned above, the noise reduction elements are each sandwiched between an area of a second surface of the first substrate over against the first surface of the first substrate and a surface of the second substrate facing the second surface of the first substrate, and thus the noise reduction elements are disposed in the vicinity of the circuit elements. This feature makes it possible to enhance a noise reduction factor by the noise reduction elements. Further, according to the circuit substrate of the present invention, the terminal of the noise reduction element serves as a part of the path of supply of electric power to the circuit elements, and the noise reduction elements are located just below the circuit elements. Thus, this feature makes it possible to shorten the path of supply of electric power to the circuit elements, and thereby preventing generation of a large noise up to a supply of an electric power to the circuit elements. That is, according to the circuit substrate of the present invention, the noise reduction factor by the noise reduction elements is enhanced and generation of a large noise is prevented. Thus, it is possible to reduce noises to the sufficient level.

In the circuit substrate according to the present invention as mentioned above, it is acceptable that the noise reduction element is a chip condenser.

Further, in the circuit substrate according to the present invention as mentioned above, it is preferable that a signal terminal of the second surface of the first substrate is connected with a signal terminal of the surface of the second substrate in accordance with a ball grid array system.

An adoption of the ball grid array system makes it possible to narrow arrangement pitches of the signal terminals of the first substrate and the second substrate, and thereby contributing to a densification of mounting of electronic components.

To achieve the above-mentioned object, the present invention provides electronic equipment on which a circuit substrate is loaded, the electronic equipment being operative in accordance with an electronic circuit constructed on the circuit substrate, wherein the circuit substrate comprises:

a first substrate on a first surface of which circuit elements are loaded;

a second substrate on which the first substrate is loaded; and noise reduction elements each sandwiched between an area of a second surface of the first substrate over against the first surface of the first substrate and a surface of the second substrate facing the second surface of the first substrate, the noise reduction elements each being connected between a power source terminal of the second surface of the first substrate and a power source terminal of the surface of the second substrate, and/or between a ground terminal of the second surface of the first substrate and a ground terminal of the surface of the second substrate.

Thus, also according to the electronic equipment of the present invention, it is possible to reduce noises to a sufficient level.

DETAILED DESCRIPTION OF PREFERRED EMBODIMENTS

Hereinafter, there will be explained a personal computer by way of example of an embodiment of electronic equipment of the present invention.

Embodiments of the present invention will be described with reference to the accompanying drawings.

Figure 3:
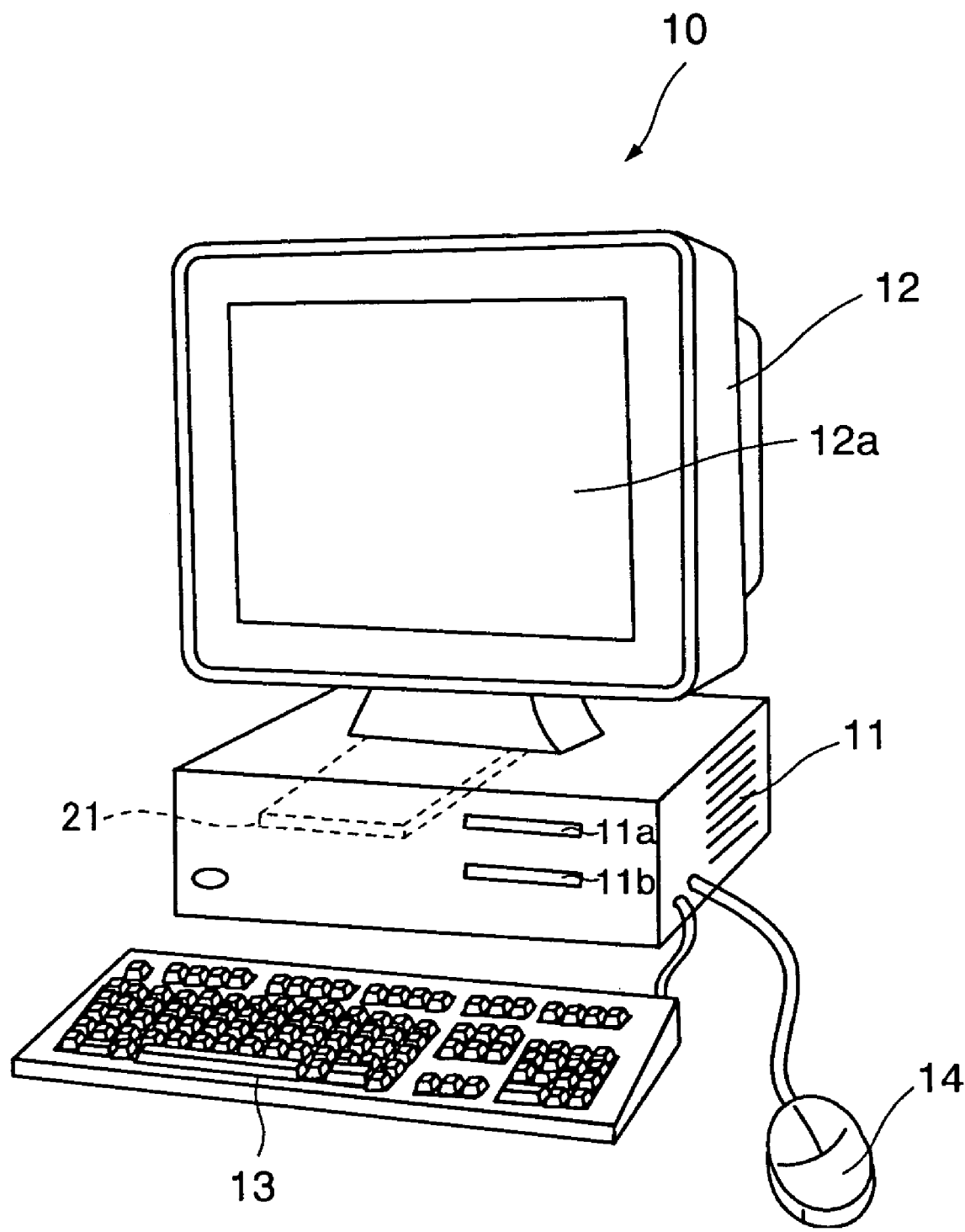
FIG. 3 is a perspective view of a personal computer that is an embodiment of electronic equipment of the present invention.

FIG. 3 is a perspective view of a personal computer that is an embodiment of electronic equipment of the present invention.

A personal computer (PC) 10 comprises: a main frame section 11 incorporating therein a CPU (central processing unit), a RAM (random access memory), a hard disk and so on; a display unit for displaying an image and a string of characters on a display screen 12a in accordance with an instruction from the main frame section 11; a keyboard 13 for inputting an instruction of a user to the PC 10; and a mouse 14 for inputting an instruction according to an icon or the like displayed at a designated position on the display screen 12a. The PC 10 corresponds to the electronic equipment of the present invention.

Figure 1:
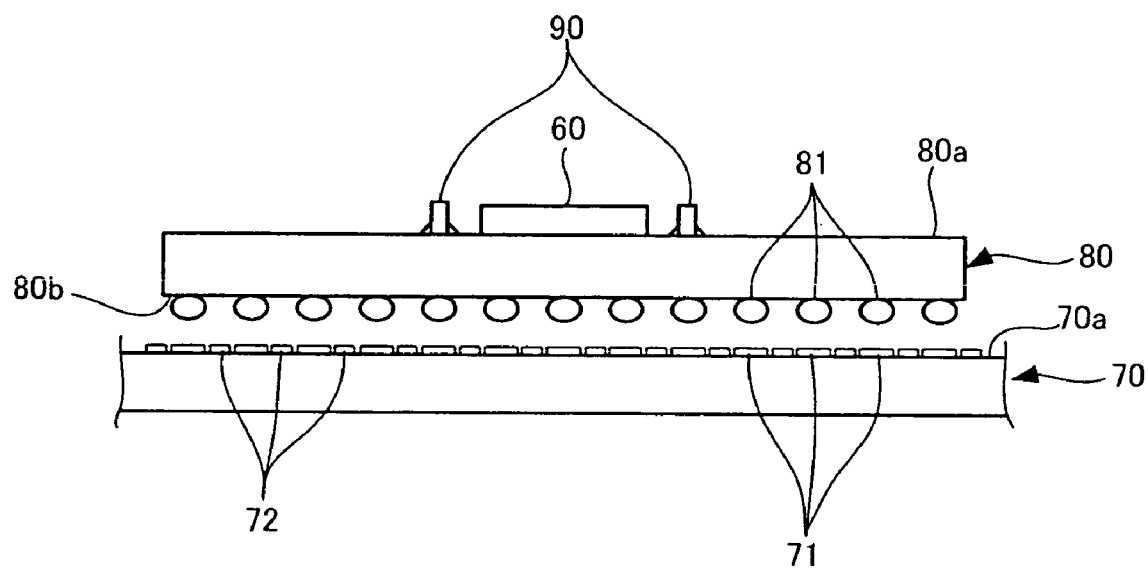
FIG. 1 is a view typically showing an example in which a semiconductor chip is loaded onto a mother board.
Figure 2:
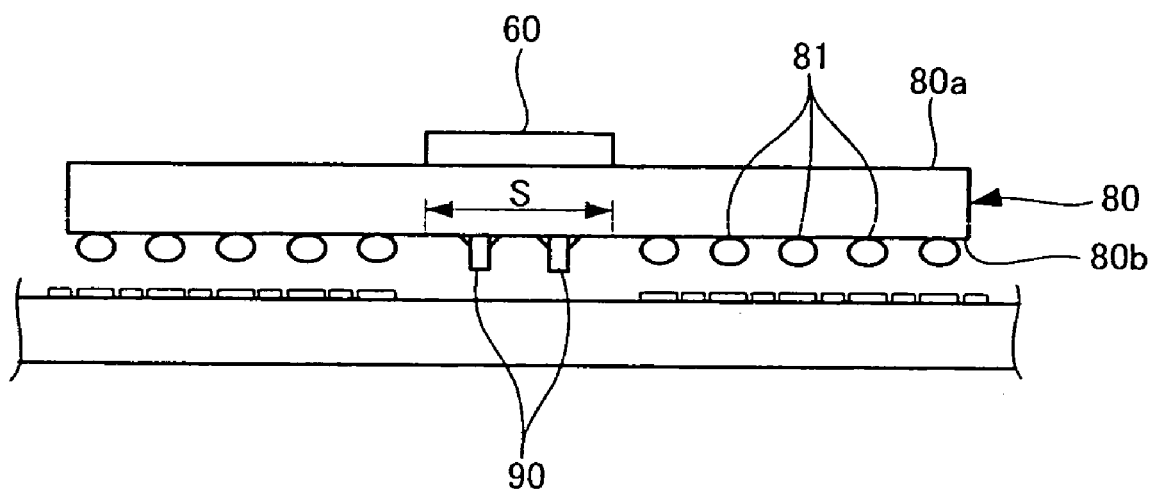
FIG. 2 is a view typically showing another example in which a semiconductor chip is loaded onto a mother board.

The main frame section 11 has, on the outside appearance, a flexible disk mounting slot 11a onto which a flexible disk (FD) is loaded, and a CD-ROM mounting slot 11b onto which a CD-ROM is loaded. Inside the main frame section 11, there are incorporated a flexible disk drive (not illustrated in FIG. 1) for driving the flexible disk loaded through the flexible disk mounting slot 11a, and a CD-ROM drive (not illustrated in FIG. 1) for driving the CD-ROM loaded through the CD-ROM mounting slot 11b.

Inside the main frame section 11, there is disposed a mother board 21. The CPU incorporated into the main frame section 11 is a package that is loaded with a semiconductor chip. This package is mounted on the mother board 21. The RAM incorporated into the main frame section 11 is mounted on the mother board 21 by a connector provided on the mother board 21. On the mother board 21, there are additionally mounted various types of electronic parts such as a QFP (Quad Flat Package) type of semiconductor package, transistors, resistance elements, and a crystal oscillator, which are not illustrated.

Figure 4:
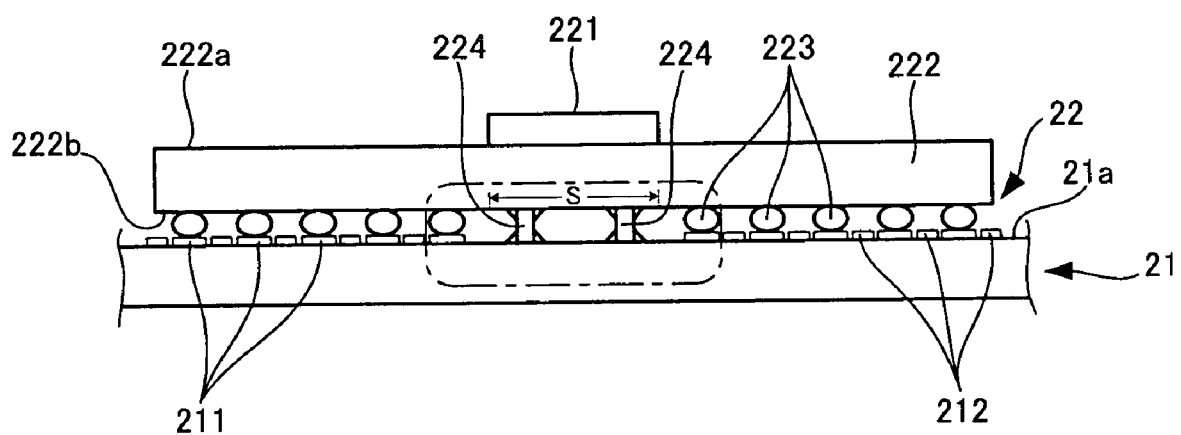
FIG. 4 is a view typically showing a state that a package of a CPU is mounted on a mother board disposed inside a main frame of the personal computer shown in FIG. 3.

FIG. 4 is a view typically showing a state that a package of a CPU is mounted on a mother board disposed inside a main frame of the personal computer shown in FIG. 3.

FIG. 4 shows a CPU package 22 and a portion, on which the CPU package 22 is mounted, of the mother board 21. A combination of the CPU package 22 and the mother board 21 corresponds to an embodiment of a circuit substrate of the present invention. The CPU package 22 corresponds to a circuit element referring to in the present invention. The mother board 21 corresponds to the second substrate referring to in the present invention.

The CPU package 22 shown in FIG. 4 has a semiconductor chip 221, a substrate 222, a large number of soldering balls 223, and a plurality of chip condensers 224. The CPU package 22 is a BGA (Ball Grid Array) package that is mounted on the surface 21a of the mother board 21. In FIG.

4, for the purpose of illustration of the semiconductor chip 221, there is shown the CPU package 22 in a state that a package member is removed. And for the purpose of better understanding of the soldering balls 223, the number of soldering balls 223 are reduced in illustration, and the respective soldering ball 223 is enlarged in illustration. The semiconductor chip 221 shown in FIG. 4 serves as the CPU, and is mounted on a surface 222a of the substrate 222 in a state that it is not molded. While it is not illustrated, on the back of the semiconductor chip 221, there are arranged four thousand or more pieces of connection terminals at interval of 150 μm.

The substrate 222 shown in FIG. 4 is of a multi-layer construction in which a plurality of wiring patterns is formed and wiring patterns of different layers are electrically connected to one another by vias. While it is not illustrated, on the surface 222a and the back 222b of the substrate 222, there are formed a large number of pads to which are each connected to a wiring pattern and a via. The four thousand or more pieces of connection terminals, which are arranged on the back of the semiconductor chip 221 shown in FIG. 4, are electrically connected to the pads of the surface 222a of the substrate 222. The substrate 222 shown in FIG. 4 corresponds to the first substrate referred to in the present invention.

A large number of soldering balls 223 of the CPU package 22 shown in FIG. 4 is provided at a position, in which the associated pad is formed, of the back 222b of the substrate 222. The plurality of chip condensers 224 of the CPU package 22 is provided in an area S, in which the semiconductor chip 221 is mounted on the surface 222a, of the back 222b of the substrate 222. Accordingly, two chip condensers 224 are disposed in the vicinity of the semiconductor chip 221, and whereby the noise reduction factor is enhanced. The chip condensers 224 correspond to the noise reduction elements referred to in the present invention. In FIG. 4, there are shown two chip condensers 224 in the area S, and the soldering balls 223 in areas out of the area S. The two chip condensers 224 shown in the area S, the soldering ball 223 shown in the just left of the area S, and the soldering ball 223 shown in the just right of the area S, are encircled by a dashed line.

On the surface 21a of the mother board 21 shown in FIG. 4, there are formed a large number of pads 211, and there are formed soldering resists 212 each provided between the adjacent pads 211. In FIG. 4, for the sake of the better understanding of the pads 211, there are shown the pads 211 with enlargement but reducing the number of those elements. The mother board 21 is, in a similar fashion to that of the substrate 222, also of a multi-layer construction in which a plurality of wiring patterns is formed and wiring patterns of different layers are electrically connected to one another by vias. The plurality of wiring patterns includes a power source line connected to a power source (not illustrated), and a ground level line connected to a ground level.

The CPU package 22 is electronically connected with the mother board 21 in such a manner that the soldering balls 223 provided on the CPU package 22 are heated so that the pads formed on the back 222b of the substrate 222 are soldered together with the pads 211 formed on the surface 21a of the mother board 21. FIG. 4 shows the CPU package 22 and the mother board 21 in a state that they are soldered together.

Next, referring to FIG. 5, there will be explained an electrical connection between the mother board 21 and the CPU package 22.

Figure 5:
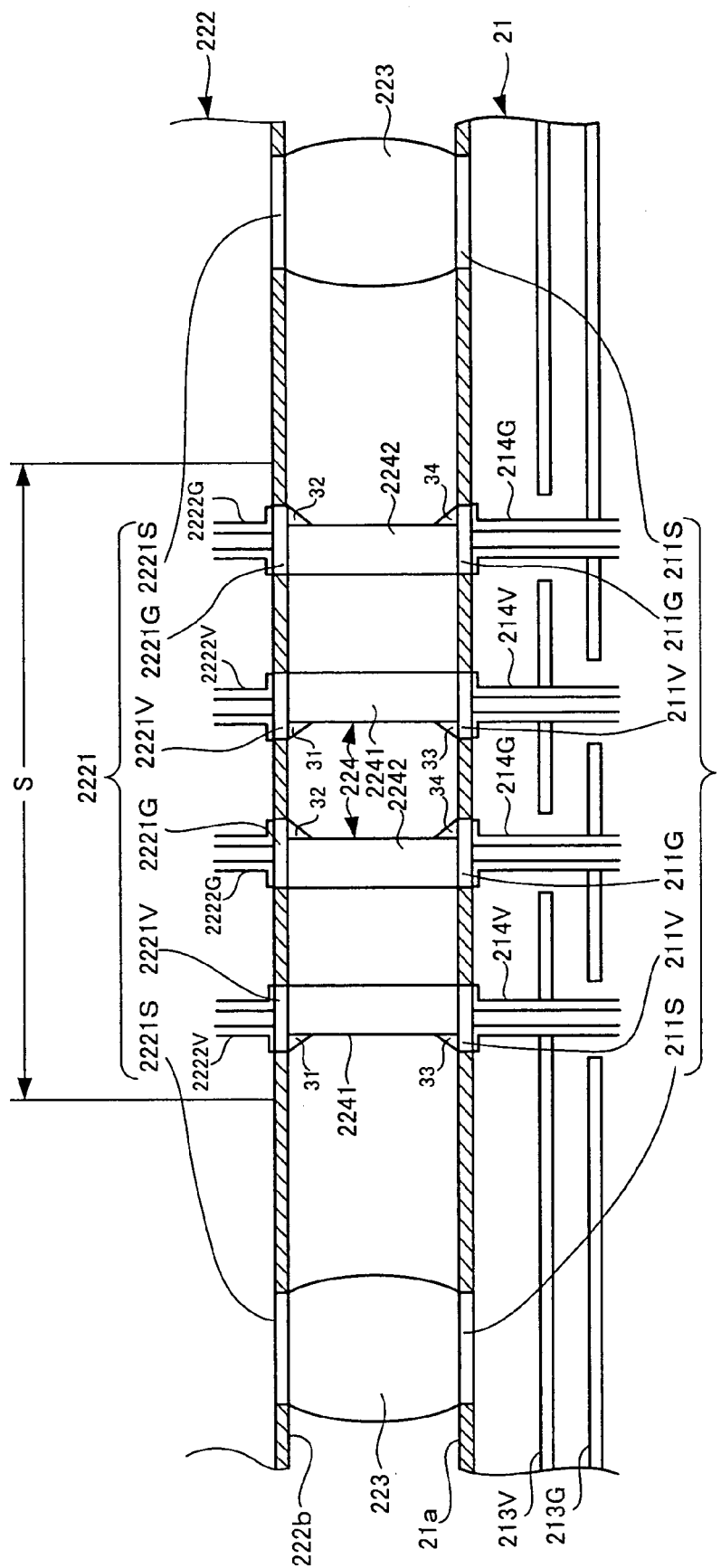
FIG. 5 is an enlarged detail of a portion encircled by a dashed line, of the circuit substrate shown in FIG. 4.

FIG. 5 is an enlarged detail of a portion encircled by a dashed line, of the circuit substrate shown in FIG. 4.

FIG. 5 shows the details of the two chip condensers 224 in the area S shown in FIG. 4. Each of the two chip condensers 224 has a power source terminal 2241 at the left side of the figure and a ground terminal 2242 at the right side of the figure. FIG. 5 shows further the soldering ball 223 shown in the left of the area S, and the soldering ball 223 shown in the right of the area S, shown in FIG. 4. FIG. 5 shows furthermore the pads 211 formed on the surface 21a of the mother board 21, and pads 2221 formed on the back 222b of the substrate 222. Also in FIG. 5, for the sake of the better understanding of the pads 211 and 2221, there are shown the pads 211 and 2221 with enlargement but reducing the number of those elements. There are provided soldering resists between the pads 211 of the surface 21a of the mother board 21, and between the pads 2221 of the back 222b of the substrate 222. In FIG. 5, the soldering resists are represented by hatching. FIG. 5 typically shows part of the sectional structures of the mother board 21 and the substrate 222. That is, FIG. 5 shows, as a part of the sectional structure of the mother board 21, a power source line 213V and a ground line 213G, of the mother board 21, and vias 214V and 214G connected to the power source line 213V and the ground line 213G, respectively. Further, FIG. 5 shows, as a part of the sectional structure of the substrate 222, a portion connected to the pads 2221, of vias 2222V for electrically connecting the pads 2221 formed on the back 222b of the substrate 222 with a power source terminal (not illustrated) of the semiconductor chip, and a portion connected to the pads 2221, of vias 2222G for electrically connecting the pads 2221 formed on the back 222b of the substrate 222 with a ground terminal (not illustrated) of the semiconductor chip. The vias 214V, 214G, 2222V and 2222G shown in FIG. 5 extend in the vertical direction of the figure.

Of the pads 2221 of the substrate 222 shown in FIG. 5, the pad, which is connected to one end of the via 2222V of which another end is connected to a power source terminal (not illustrated) of the semiconductor chip, is referred to as a power source pad 2221V, and the pad, which is connected to one end of the via 2222G of which another end is connected to a ground terminal (not illustrated) of the semiconductor chip, is referred to as a ground pad 2221G. The power source pad 2221V of the substrate 222 corresponds to the power source terminal of the first substrate referred to in the present invention. And the ground pad 2221G of the substrate 222 corresponds to the ground terminal of the first substrate referred to in the present invention. While the illustration is omitted, the power source terminal of the semiconductor chip is disposed just above the power source pad 2221V, and the ground terminal of the semiconductor chip is disposed just above the ground pad 2221G. Accordingly, the power source pad 2221V is connected to the power source terminal of the semiconductor chip through the via 2222V in the shortest distance, and the ground pad 2221G is connected to the ground terminal of the semiconductor chip through the via 2222G in the shortest distance. The power source pad 2221V and the ground pad 2221G are provided within the area S. A solder 31 solder the power source pad 2221V and the power source terminal 2241 of the chip condenser 224. A solder 32 solders the ground pad 2221G and the ground terminal 2242 of the chip condenser 224. The pad 2221 of the substrate, on which the soldering balls 223 are provided as shown in FIG. 5, is referred to as a signal pad 2221S. The signal pad 2221S of the substrate 222 shown in FIG. 5 corresponds to the signal terminal of the first substrate referred to in the present invention.

Of the pads 211 of the mother board 21 shown in FIG. 5, the pad, which is connected to the power source line 213V via the via 214V, is referred to as a power source pad 211V, and the pad, which is connected to the power source line 213G via the via 214G, is referred to as a ground pad 211G. The power source pad 211V of the mother board 21 corresponds to the power source terminal of the second substrate referred to in the present invention. And the ground pad 211G of the mother board 21 corresponds to the ground terminal of the second substrate referred to in the present invention. The power source pad 211V of the mother board 21 is disposed over against the power source pad 2221V of the substrate, and the ground pad of the mother board 21 is disposed over against the ground pad 2221G of the substrate. The pad 211 of the mother board 21, which is disposed over against a signal pad 2221S of the substrate, is referred to as a signal pad 211S. The signal pad 211S of the mother board 21 corresponds to the signal terminal of the second substrate referred to in the present invention. A soldering ball 223 is heated so that the signal pad 211S of the mother board 21 and the signal pad 2221S of the substrate are soldered together.

A solder 33 solders the power source pad 211V of the mother board 21 and the power source terminal 2241 soldered together with the power source pad 2221V of the substrate, of each of the chip condensers 224 disposed in the area S. On the other hand, a solder 34 solders the ground pad 211G of the mother board 21 and the ground terminal 2242 soldered together with the ground pad 2221G of the substrate, of each of the chip condensers 224 disposed in the area S.

The electric connection of the mother board 21 and the CPU package 22 as mentioned above forms a path of power supply to the semiconductor chip 221 shown in FIG. 4 which is loaded onto the substrate. This path is provided, at the power source side, by the power source line 213V of the mother board 21, the via 214V connected to the power source line 213V, the power source pad 211V of the mother board 21, the power source terminal 2241 of the chip condenser, the power source pad 2221V of the substrate, the via 2222V connected to the power source pad 2221V, and the power source terminal (not illustrated) of the semiconductor chip in the named order. Further, the path is provided, at the ground side, by the ground terminal (not illustrated) of the semiconductor chip, the via 2222G connected to the ground pad 2221G of the substrate, the ground pad 2221G, the ground terminal 2242 of the chip condenser, the ground pad 211G of the mother board 21, the via 214G connected to the ground pad 211G, and the ground line 213G of the mother board 21. Accordingly, the power source terminal 2241 and the ground terminal 2242 of each of the two chip condensers 224 shown in FIG. 5 serve as a part of the path of supply for electric power to the semiconductor chip 221 shown in FIG. 4. As mentioned above, the power source pad 2221V of the substrate is connected to the power source terminal of the semiconductor chip through the via 2222V in the shortest distance, and the ground pad 2221G of the substrate is connected to the ground terminal of the semiconductor chip through the via 2222G in the shortest distance. Accordingly, this makes it possible to prevent generation of a large noise up to a supply of electric power to the semiconductor chip 221.

Incidentally, the present invention is not restricted to one, as in the present embodiment, in which the chip condensers 224 are connected both between the power source pad 2221V of the substrate and the power source pad 211V of the mother board 21, and between the ground pad 2221G of the substrate and the ground pad 211G of the mother board 21. And according to the present invention, it is acceptable that the chip condenser 224 is connected either between the power source pad 2221V of the substrate and the power source pad 211V of the mother board 21, or between the ground pad 2221G of the substrate and the ground pad 211G of the mother board 21. As in the present embodiment, one, in which the chip condensers 224 are connected both between the power source pad 2221V of the substrate and the power source pad 211V of the mother board 21, and between the ground pad 2221G of the substrate and the ground pad 211G of the mother board 21, is more effective in reduction of noises. However, even in the event that the chip condenser 224 is connected either between the power source pad 2221V of the substrate and the power source pad 211V of the mother board 21, or between the ground pad 2221G of the substrate and the ground pad 211G of the mother board 21, it is possible to expect an excellent effect in reduction of noises as compared with the prior art. In the event that the chip condenser 224 is connected only between the power source pad 2221V of the substrate and the power source pad 211V of the mother board 21, it is acceptable that the ground pad 2221G of the substrate and the ground pad 211G of the mother board 21 are connected together with one another by the soldering balls in a similar fashion to that between other signal pads, or not connected. In the event that the chip condenser 224 is connected only between the ground pad 2221G of the substrate and the ground pad 211G of the mother board 21, it is acceptable that the power source pad 2221V of the substrate and the power source pad 211V of the mother board 21 are connected together with one another by the soldering balls in a similar fashion to that between other signal pads, or not connected. With respect to the path coupling the power source pad 2221V of the substrate with the power source terminal of the semiconductor chip, and the path coupling the ground pad 2221G of the substrate with the ground terminal of the semiconductor chip, it is perferable that those paths are formed by a single via as in the present embodiment in the point that the lengths of those paths can be provided in the shortest distance. However, it is acceptable that those paths are formed using a plurality of vias and a part of the wiring pattern as long as the lengths of those paths are suppressed as short as possible. For example, as a criterion of a suppression of the lengths of those paths as short as possible, there is raised an example in which those paths are accommodated in a region interposed between the surface area, onto which the semiconductor chip 221 is loaded, of the substrate 222 and the area S shown in FIG. 5.

According to the embodiment of the electronic equipment of the present invention as mentioned above, while there is raised a personal computer by way of example, it is noted that the electronic equipment of the present invention is widely applicable to general electronic equipment such as a workstation and a server machine. Further, according to the to the embodiment of the circuit substrate of the present invention as mentioned above. while there is raised an example in which a CPU package is mounted on a mother board, it is noted that the circuit substrate of the present invention is applicable to many cases that a substrate, onto which a control system of semiconductor chip is loaded, is loaded onto various types of board such as a mother board. Furthermore, according to the to the present embodiment, while the CPU package is a BGA package, the CPU package is not restricted to the BGA package, and it is acceptable that the CPU package is a PGA (Pin Grid Array) package or a LGA (Land Grid Array) package. Still further, according to the to the present embodiment, while there is used the chip condenser, as the element for reducing noises, the noise reduction element is not restricted to the chip condenser, and it is acceptable that the noise reduction element is a chip coil or a varistor.

According to the present invention, it is possible to provide a circuit substrate and electronic equipment capable of reducing noises to a sufficient level.

Although the present invention has been described with reference to the particular illustrative embodiments, it is not to be restricted by those embodiments but only by the appended claims. It is to be appreciated that those skilled in the art can change or modify the embodiments without departing from the scope and sprit of the present invention.

What is claimed is:

1. A circuit substrate comprising:
   a first substrate on a first surface of which circuit elements are loaded;
   a second substrate on which the first substrate is loaded; and
   noise reduction elements each sandwiched between an area of a second surface of the first substrate over against the first surface of the first substrate and a surface of the second substrate facing the second surface of the first substrate, the noise reduction elements each being connected between a power source terminal of the second surface of the first substrate and a power source terminal of the surface of the second substrate, wherein the power source terminal of the first substrate is electrically connected to a power source line of the second substrate through a via.

2. A circuit substrate according to claim 1, wherein the noise reduction element is a chip condenser.

3. A circuit substrate according to claim 1, wherein a signal terminal of the second surface of the first substrate is connected with a signal terminal of the surface of the second substrate in accordance with a ball grid array system.

4. A circuit substrate according to claim 1, wherein the noise reduction elements are each connected between a ground terminal of the second surface of the first substrate and a ground terminal of the surface of the second substrate.

5. A circuit substrate according to claim 2, wherein a signal terminal of the second surface of the first substrate is connected with a signal terminal of the surface of the second substrate in accordance with a ball grid array system.

6. Electronic equipment on which a circuit substrate is loaded, the electronic equipment being operative in accordance with an electronic circuit constructed on the circuit substrate, wherein the circuit substrate comprises:
   a first substrate on a first surface of which circuit elements are loaded;
   a second substrate on which the first substrate is loaded; and
   noise reduction elements each sandwiched between an area of a second surface of the first substrate over against the first surface of the first substrate and a surface of the second substrate facing the second surface of the first substrate, the noise reduction elements each being connected between a power source terminal of the second surface of the first substrate and a power source terminal of the surface of the second substrate, wherein the power source terminal of the first substrate is electrically connected to a power source line of the second substrate through a via.

7. Electronic equipment according to claim 6, wherein the noise reduction element is a chip condenser.

8. Electronic equipment according to claim 6, wherein a signal terminal of the second surface of the first substrate is connected with a signal terminal of the surface of the second substrate in accordance with a ball grid array system.

9. A circuit substrate according to claim 6, wherein the noise reduction elements are each connected between a ground terminal of the second surface of the first substrate and a ground terminal of the surface of the second substrate.

10. Electronic equipment according to claim 7, wherein a signal terminal of the second surface of the first substrate is connected with a signal terminal of the surface of the second substrate in accordance with a ball grid array system.

* * * * *